(12) United States Patent
Inoue et al.

(10) Patent No.: US 7,735,221 B2
(45) Date of Patent: Jun. 15, 2010

(54) METHOD FOR MANUFACTURING A MULTILAYER WIRING BOARD

(75) Inventors: Tatsuo Inoue, Tokyo (JP); Osamu Arai, Tochigi (JP); Katsushi Mikuni, Aomori (JP); Norihiro Imai, Aomori (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 140 days.

(21) Appl. No.: 12/099,691

(22) Filed: Apr. 8, 2008

(65) Prior Publication Data
US 2008/0315901 A1    Dec. 25, 2008

(30) Foreign Application Priority Data
May 14, 2007    (JP)    ............................. 2007-128292

(51) Int. Cl.
*H05K 3/02*    (2006.01)
*H05K 3/10*    (2006.01)
(52) U.S. Cl. .............................. 29/846; 29/620; 29/852; 174/260; 257/537
(58) Field of Classification Search ................ 29/610.1, 29/620, 830, 846, 852; 174/260; 257/536, 257/537; 338/307, 308, 314
See application file for complete search history.

(56) References Cited

U.S. PATENT DOCUMENTS 4,870,746 A * 10/1989 Klaser .......................... 29/620

6,727,556 B2 * 4/2004 Shiiki et al. .................. 257/536

FOREIGN PATENT DOCUMENTS

| JP | 2000-013016 | 1/2000 |
|----|-------------|--------|
| JP | 2005-017121 | 1/2005 |

OTHER PUBLICATIONS

Pat. Abstract of JP (2000-013016), Jan. 14, 2000, NEC Corporation.
Pat. Abstract of JP (2005-017121), Jan. 20, 2005, Micronics Japan Co LTD.

* cited by examiner

*Primary Examiner*—Donghai D. Nguyen
(74) *Attorney, Agent, or Firm*—Ingrassia Fisher & Lorenz, P.C.

(57) ABSTRACT

A method of manufacturing a multilayer wiring board is provided. A flat surface is formed on a surface of a multilayer wiring layer, and resistive material is deposited on the flat surface. The multilayer wiring board comprises a multilayer wiring layer on whose surface convexo-concave is formed, a dummy layer burying the convexo-concave, a resistance material layer made of an electrical resistance material deposited on the dummy layer and at an area going beyond the dummy layer, and a wire made of a conductive material deposited on the resistance material layer and ranging from the area going beyond the dummy layer to a part of the flat surface area of the dummy layer, wherein a resistive element is formed at an area of the resistance material layer that the wire does not reach.

3 Claims, 9 Drawing Sheets

METHOD FOR MANUFACTURING A MULTILAYER WIRING BOARD

BACKGROUND OF THE INVENTION

The present invention relates to a multilayer wiring board and a method for manufacturing the same and a probe apparatus using the multilayer wiring board.

Semiconductor ICs such as semiconductor chips are collectively formed on a semiconductor wafer and undergo an electrical test before being separated into respective chips. For this electrical test, a probe apparatus connected to electrode pads of each semiconductor IC as a device under test is used in general. Respective probes of the probe apparatus contact the corresponding electrode pads of the device under test to cause the device under test to be connected to a tester for the electrical test (for example, refer to Patent Document 1).

In such a probe apparatus, a multilayer wiring board is used as a probe board, and numerous probes are arranged on one surface of the probe board. Also, in wiring circuits built in this probe board or multilayer wiring board, electrical resistive elements are built for the purpose of electrical matching such as impedance matching.

A method for building the resistive elements in the multilayer wiring board is proposed in Patent Document 2, for example. With the method described in Patent Document 2, in relation to a manufacturing process of a multilayer wiring board having an insulating substrate and a multilayer wiring layer provided on the insulating substrate, a titanium nitride film functioning as a foundation layer for wires and functioning as resistive elements is formed on the multilayer wiring layer, and wires are formed on the titanium nitride film by a conductor such as copper, thus to enable efficient building of the resistive elements in the multilayer wiring board.

Meanwhile, in the multilayer wiring layer of the multilayer wiring board, a lower-layer conductive layer formed on the insulating substrate and an upper-layer conductive layer piled on the lower-layer conductive layer via an intermediate insulating layer are connected, for example. For this connection between the both conductive layers, a via hole penetrating the intermediate insulating layer in the thickness direction is formed, and the lower-layer conductive layer and the upper-layer conductive layer are electrically connected through a via deposited in the via hole. When a metal material for this via is deposited in the via hole, the metal material for the via partially rises at the rim portion of the via hole. Thus, when an upper-layer insulating film is formed to cover the upper-layer conductive layer connected to the lower-layer conductive layer through the via, convexo-concave corresponding to the rise of the via is formed on this upper-layer insulating film.

When the aforementioned resistive elements are formed on this convexo-concave upper-layer insulating film by deposition of their material, these resistive elements are formed in a waved shape in the up-down direction along the convexo-concave surface of the aforementioned upper-layer insulating film. Accordingly, the substantial length of each resistive element increases, and the thickness dimension of the resistive element tends to change partially, as a result of which there is a disadvantage of increase in an error of a value of each resistive element built in the multilayer wiring board.

(Patent Document 1) Japanese Patent Appln. Public Disclosure No. 2005-17121; (Patent Document 2) Japanese Patent Appln. Public Disclosure No. 2000-13016

BRIEF SUMMARY OF THE INVENTION

It is an object of the present invention to provide a multilayer wiring board in which resistive elements each of whose error from a desired value is smaller than in a conventional case are built, a method for manufacturing the same, and a probe apparatus utilizing the multilayer wiring board.

The present invention is characterized by forming a flat surface on a surface of a multilayer wiring layer on which a resistive element material is to be deposited and depositing the resistive element material on the flat surface.

More specifically, a method for manufacturing a multilayer wiring board according to the present invention comprises the steps of forming a flat surface at a desired area on a surface of a multilayer wiring board having a multilayer wiring layer on whose surface convexo-concave is formed, and depositing an electrical resistance material on the flat surface to form a resistive element.

The resistive element made of the electrical resistance material deposited on the flat surface will not wave in the up-down direction along the convexo-concave surface as in the conventional case, and it is possible to prevent increase or decrease of the substantial length of the resistor due to this meandering path in the up-down direction and variation in the thickness dimension due to deposition of the electrical resistance material on the convexo-concave surface. Thus, since the resistive element showing an accurate resistance value can be formed, it is possible to provide the multilayer wiring board in which variation in the resistance value is smaller than in the conventional case.

The flat surface may be formed by a surface of a dummy layer. The dummy layer may be formed by depositing a material for the dummy layer so that the material may have a thickness dimension enough to bury the convexo-concave surface within the desired area and to form an approximately flat surface.

The dummy layer may be made of a conductive material. For formation of the dummy layer made of the conductive material, a resist mask exposing an area for forming the flat surface is formed by a photoresist on the surface of the multilayer wiring layer, and the conductive material for the dummy layer may be deposited at the area exposed from the resist mask.

An electroplating method may be used for deposition of the conductive material for the dummy layer. By this electroplating method, the dummy layer whose surface is flat can be formed by depositing the conductive material for the dummy layer so that the material may have a thickness dimension enough to bury the convexo-concave of the surface and thereafter polishing the material to be a flat surface.

The conductive material for the dummy layer may be deposited at the same time as deposition of a conductive material for formation of a wire on the multilayer wiring layer. Consequently, it is possible to form the multilayer wiring board more efficiently.

An insulating layer made of an electrical insulating material may be formed on the dummy layer, and the electrical resistance material may be deposited on the insulating layer.

In the electroplating for formation of the dummy layer, pulse current may be used. By controlling this pulse current appropriately, the surface of the dummy layer can be flattened more than in normal electroplating using direct current. Thus, by selecting conditions of pulse current appropriately, the dummy layer having a flat surface can be formed without doing flat-surface polishing.

A multilayer wiring board according to the present invention comprises a multilayer wiring layer on whose surface convexo-concave is formed, a dummy layer burying the convexo-concave within a desired area of the surface of the multilayer wiring layer and having an approximately flat surface, a resistance material layer made of an electrical resistance material deposited on the dummy layer and at an area going beyond the dummy layer, and a wire made of a conductive material deposited on the resistance material layer and ranging from the area going beyond the dummy layer to a part of the flat surface area of the dummy layer, wherein a resistive element is formed at an area of the resistance material layer that the wire does not reach.

In the multilayer wiring board according to the present invention, since the resistive element is formed on the flat surface, increase or decrease of the substantial length of the resistor due to the meandering path in the up-down direction along the convexo-concave surface as in the conventional case is prevented. Thus, with the multilayer wiring board according to the present invention, since variation in the resistance value of the resistive element can be reduced more than in the conventional case, it is possible to improve accuracy of the resistance value of the resistive element built therein.

The dummy layer may be made of a conductive material deposited in the same layer as that of a conductive material for forming a wire on the surface of the multilayer wiring board.

An insulating layer covering the dummy layer may be formed on the dummy layer, and the resistive element may be formed on the dummy layer via the insulating layer.

The dummy layer made of the conductive material may function as a wire electrically connected to another conductive layer under the dummy layer.

A probe apparatus according to the present invention comprises a probe board comprising a multilayer wiring board having a multilayer wiring layer, a plurality of probes provided on a surface of the multilayer wiring layer of the probe board and connected to conductive paths of the multilayer wiring layer, and a resistive element connected to the conductive paths of the multilayer wiring layer, wherein on the surface of the multilayer wiring layer is formed convexo-concave, at a desired area of the surface of the multilayer wiring layer is formed a dummy layer having a flat surface that buries the convexo-concave surface within the area, and on the dummy layer is formed the resistive element.

With the probe apparatus according to the present invention, since the resistive element formed on the probe board can be formed accurately so that its resistance value may become a desired value, electrical matching such as impedance matching can be done appropriately, and a highly accurate electrical test can be done by restricting troubles such as noise.

The dummy layer may be made of a conductive material layer deposited on the multilayer wiring layer in the same layer as that of a pad portion of the multilayer wiring board to which the probe is fixed. On the dummy layer may be formed an insulating layer covering the dummy layer, and the resistive element may be formed on the dummy layer via the insulating layer.

An electrical resistance material layer may be formed on the dummy layer and at an area going beyond the dummy layer, on the electrical resistance material layer may be formed a wire made of a conductive material deposited on the electrical resistance material layer and ranging from the area going beyond the dummy layer to a part of the flat surface area of the dummy layer, and the resistive element may be formed at an area of the resistance material layer that the wire does not reach.

By forming the dummy layer by the conductive material, the dummy layer may function as a wire electrically connected to another conductive layer under the dummy layer.

According to the present invention, since the resistive element is formed on the flat surface, and increase or decrease of the effective length due to meandering of the resistive element can be prevented, it is possible to provide the multilayer wiring board and the probe apparatus building therein the resistive element having an electrical resistance value with a smaller error than in the conventional case.

DETAILED DESCRIPTION OF THE INVENTION

Figure 5:
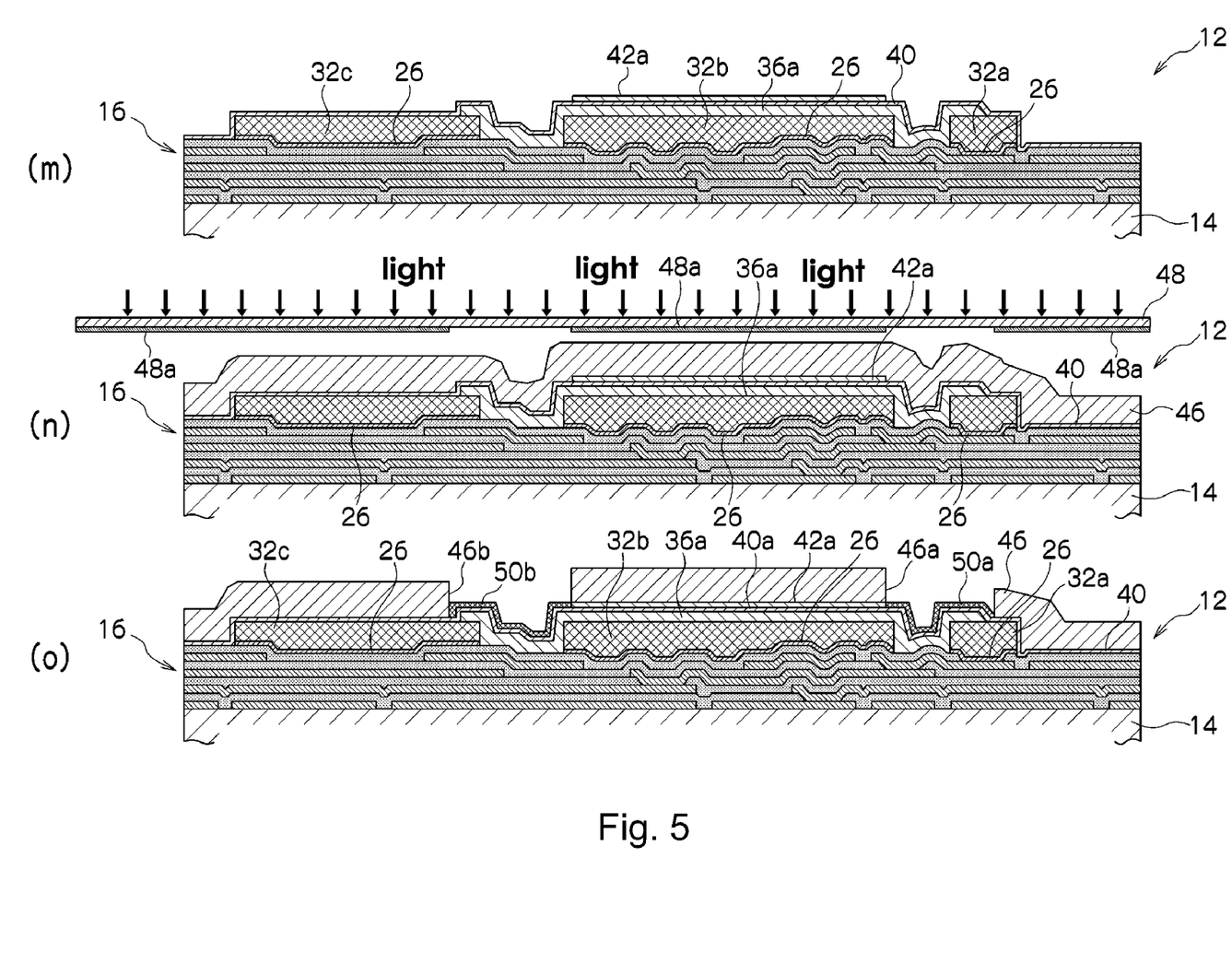
FIG. 5 is a schematic view showing the process for manufacturing the probe apparatus according to the present invention (No. 5).
Figure 6:
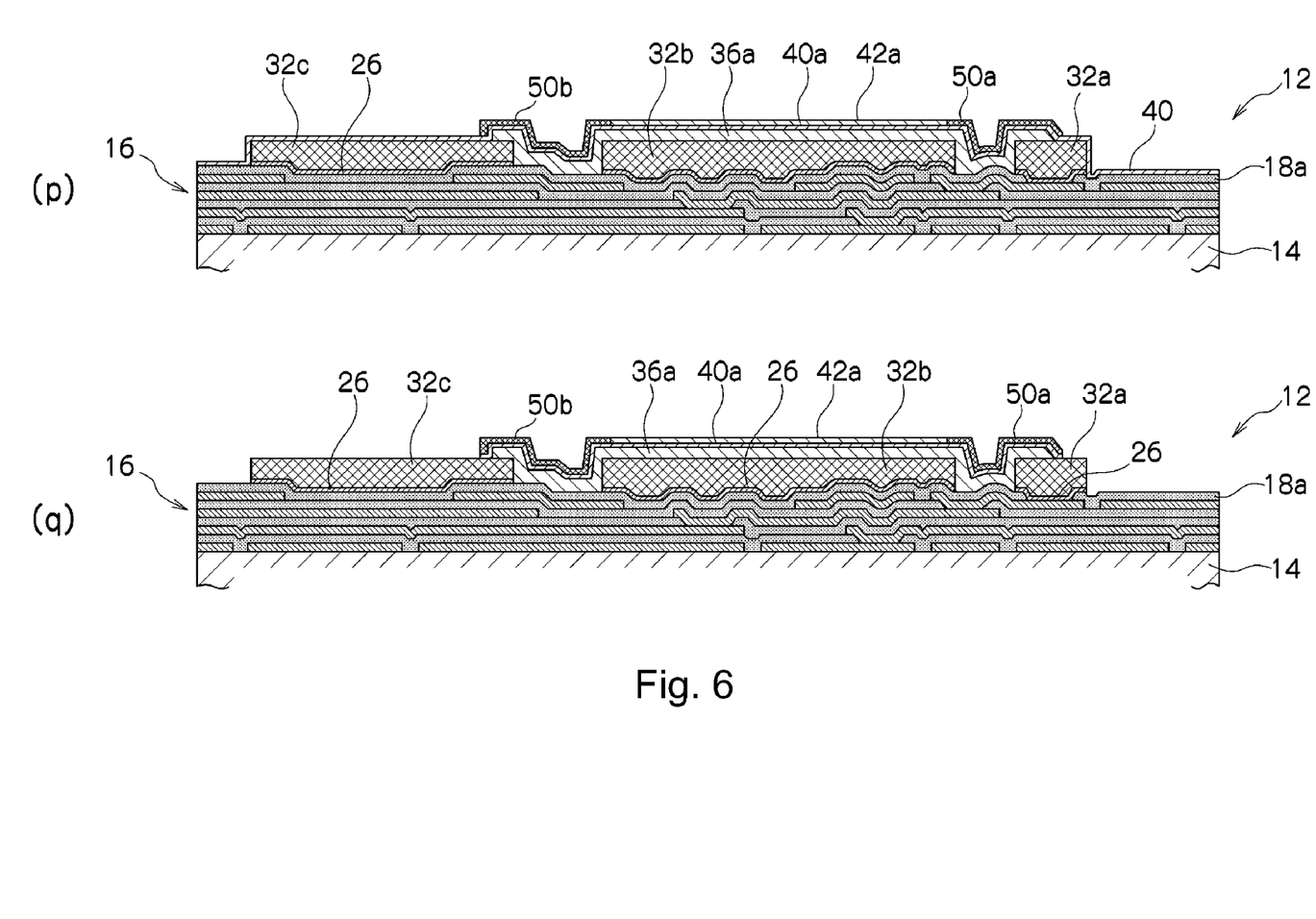
FIG. 6 is a schematic view showing the process for manufacturing the probe apparatus according to the present invention (No. 6).
Figure 7:
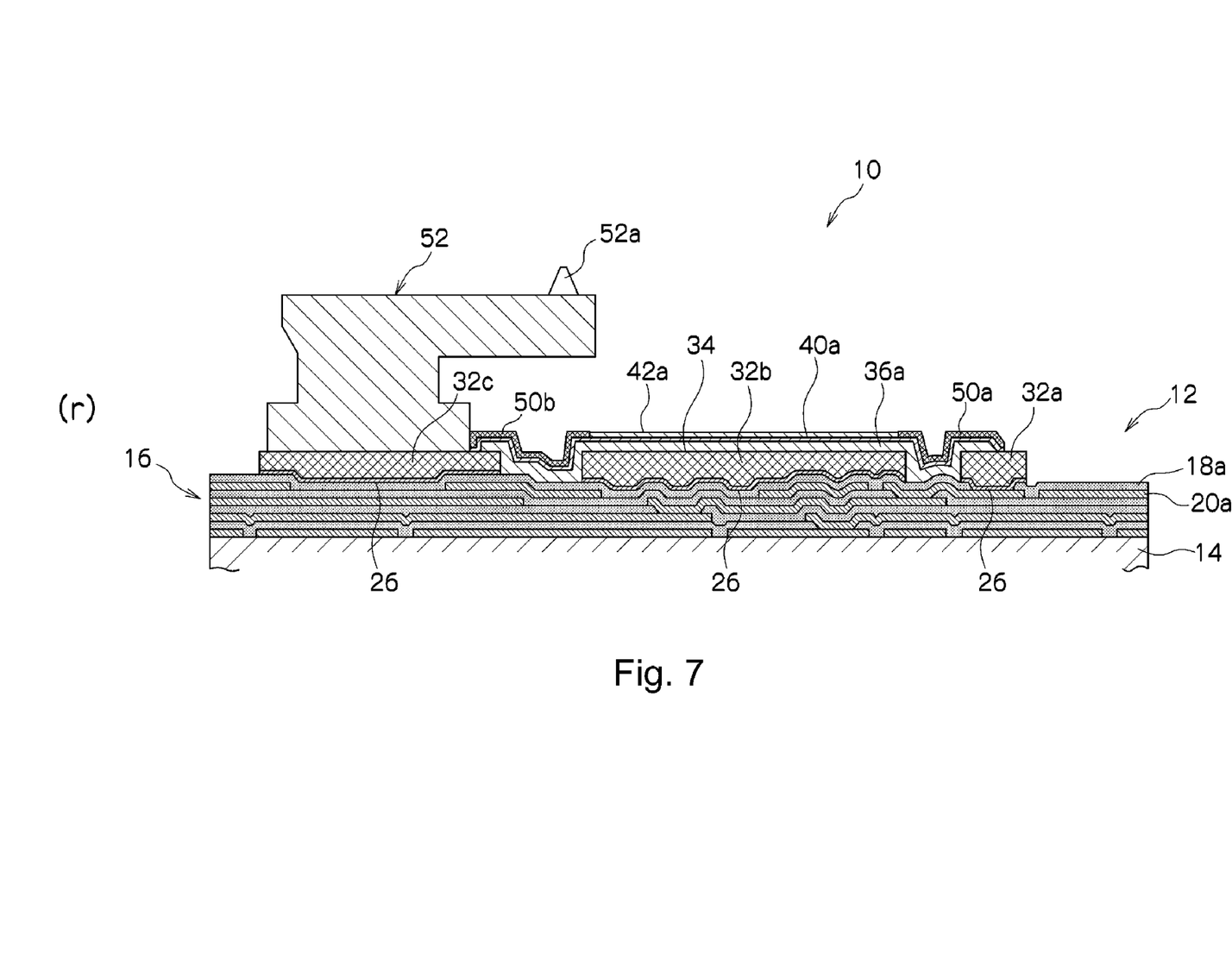
FIG. 7 is a cross-sectional view showing an embodiment of a probe apparatus according to the present invention.

FIGS. 1 to 7 show a method for manufacturing a probe apparatus 10 (refer to FIG. 7 (*r*)) according to the present invention. In the probe apparatus 10 according to the present invention, a multilayer wiring board 12 is used as its probe board.

Figure 1:
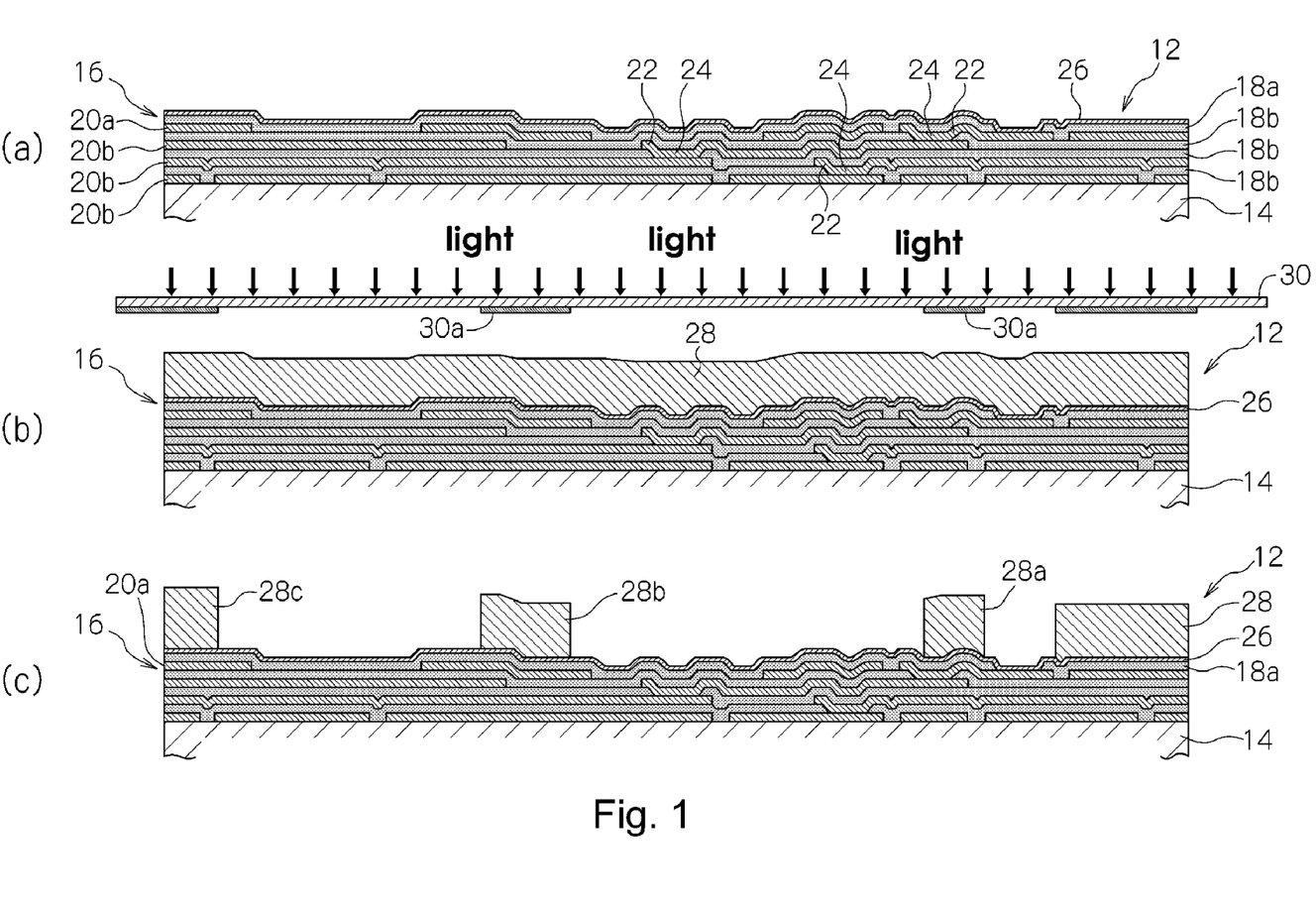
FIG. 1 is a schematic view showing a process for manufacturing a probe apparatus according to the present invention (No. 1).

As shown in FIG. 1 (*a*), the multilayer wiring board 12 according to the present invention comprises an insulating substrate 14 such as a ceramic and a multilayer wiring layer 16 deposited on the insulating substrate. The multilayer wiring layer 16 has a plurality of insulating layers 18 (18*a*, 18*b*, 18*b* . . . ) and a plurality of conductive layers 20 (20*a*, 20*b*, 20*b* . . . ) each formed between the insulating layers 18.

The multilayered conductive layers 20 are electrically connected to each other by way of a via 24 formed through a via hole 22 in the insulating layer 18 located therebetween. For formation of this via 24, at the rim portion surrounding the via 24 of each insulating layer 18 and conductive layer 20 is formed convexo-concave along with presence/absence of the conductive layer 20, and convexo-concave on the surface of the uppermost insulating layer 18*a* is significant depending on the positional relationship between the upper and lower vias 24.

Under such circumstances, a later-described flat surface is formed on the surface of the multilayer wiring board 12 by applying the following process according to the present invention. For formation of connection pads for predetermined probes in relation to formation of this flat surface, a conductive metal layer 26 such as Ti or Pd is formed by e.g., a sputtering method so as to cover the entire surface of the insulating layer 18a, which is a surface of the multilayer wiring board 12.

Next, as shown in FIG. 1 (b), a photoresist 28 is applied by using e.g., a spin coat method so as to cover the entire surface of the conductive metal layer 26, and predetermined parts of this photoresist 28 are removed. In a case where the photoresist 28 is in a positive type, the photoresist 28 is exposed through a glass mask 30 for exposing of parts to be removed. By a development process after this exposure, parts corresponding to transmissive areas excluding shielded areas 30a of the glass mask 30 are removed out of the photoresist 28 as shown in FIG. 1 (c). These transmissive areas correspond to respective areas for a below-described electrode pad, a dummy layer and a probe connection pad, that is, an opening 28a for the electrode pad, an opening 28b for the dummy layer, and an opening 28c for the probe connection pad are respectively formed in the photoresist 28, in the example shown in the figure.

Figure 2:
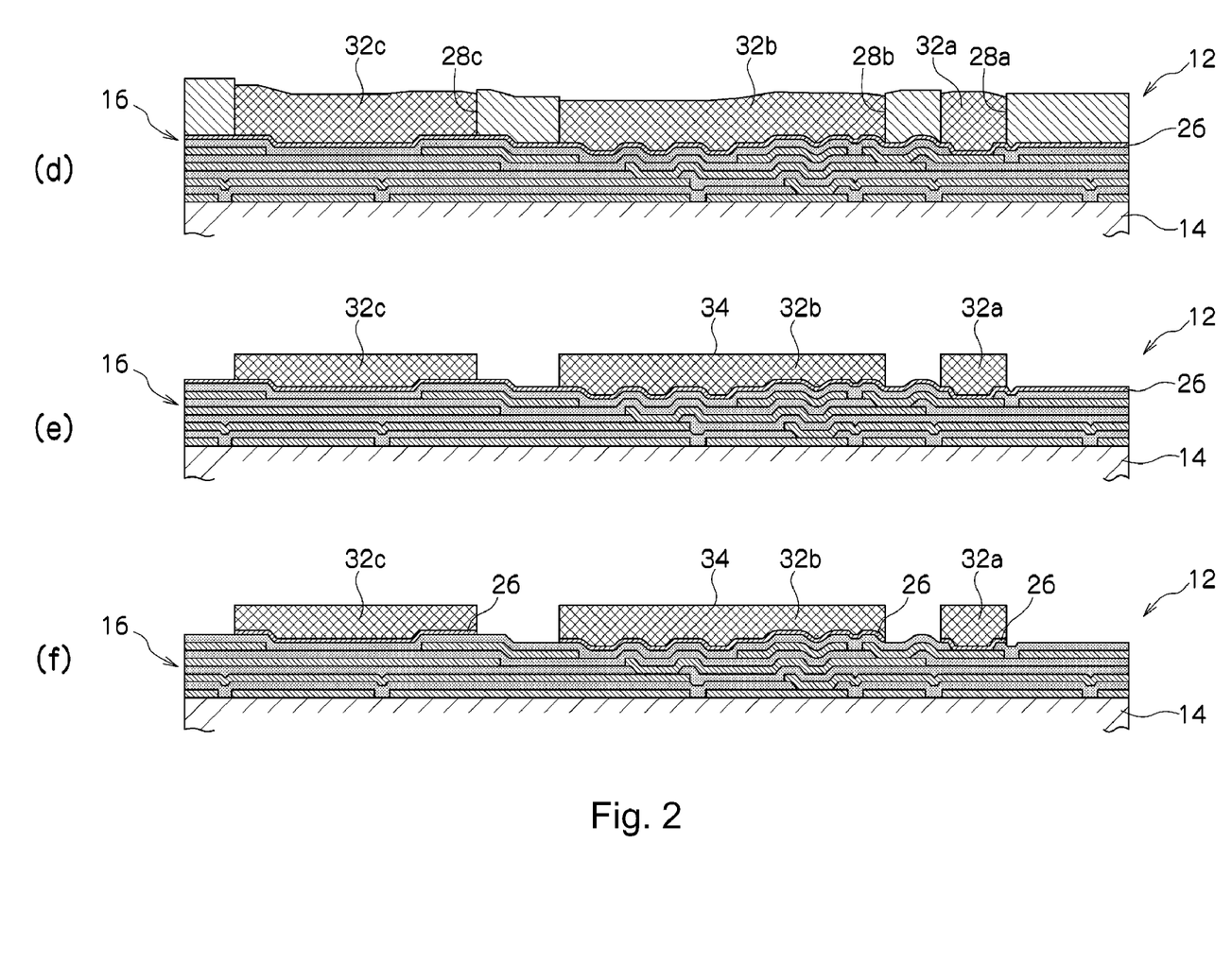
FIG. 2 is a schematic view showing the process for manufacturing the probe apparatus according to the present invention (No. 2).

In these openings 28a, 28b and 28c of the photoresist 28 are deposited conductive metal materials 32 (32a, 32b, 32c) such as copper via the conductive metal layer 26 by e.g., an electroplating method referred to as an electroforming method, as shown in FIG. 2 (d). Since the surfaces of the conductive metal materials 32 deposited by the plating are influenced by convexo-concave on the surface of the foundation layer, variation in the thickness dimension of the plated layer, and so on, the surfaces of the conductive metal materials 32 are not flat.

Then, as shown in FIG. 2 (e), after the photoresist 28 is removed, the surfaces of the conductive metal materials 32 (32a, 32b, 32c) undergo flat-surface polishing by e.g., chemical mechanical polishing (CMP). By this flat-surface polishing, the surface of the dummy layer 32b constituted by the conductive metal material 32 becomes a flat surface 34 similar to those of the electrode pad 32a and the probe connection pad 32c.

After the flat-surface polishing of the conductive metal materials 32, parts of the conductive metal layer 26 without deposition of conductive metal material 32 are removed by e.g., etching processing using ion beam. By this etching processing are formed the electrode pad 32a, the dummy layer 32b, and the probe connection pad 32c mutually insulated and each having a flat surface (34), as shown in FIG. 2 (f).

Figure 3:
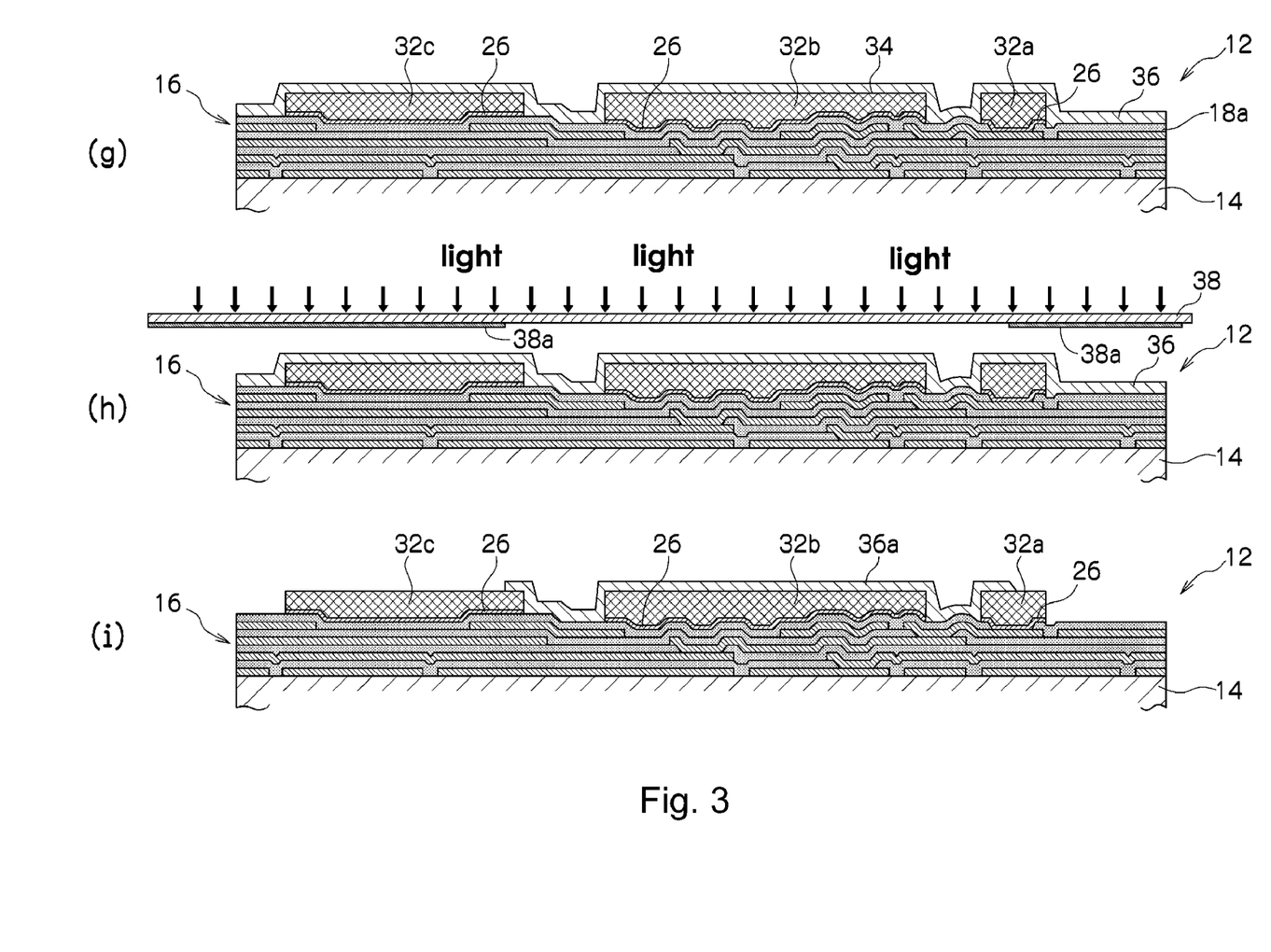
FIG. 3 is a schematic view showing the process for manufacturing the probe apparatus according to the present invention (No. 3).

After formation of the electrode pad 32a, the dummy layer 32b and the probe connection pad 32c, a photosensitive insulating layer 36 such as photosensitive polyimide is formed by e.g., the aforementioned spin coat method on the electrode pad 32a, the dummy layer 32b, the probe connection pad 32c and the insulating layer 18a exposed therefrom as shown in FIG. 3 (g). This photosensitive insulating layer 36 is formed to have a uniform thickness dimension on the flat surfaces (34) on the electrode pad 32a and the probe connection pad 32c including the dummy layer 32b.

For removal of unnecessary parts out of the photosensitive insulating layer 36, the photosensitive insulating layer 36 is partially exposed with use of a glass mask 38, as shown in FIG. 3 (h). In a case where the photosensitive insulating layer 36 is in a negative type, for the purpose of exposing an area of the photosensitive insulating layer 36 that should remain, shielded areas 38a corresponding to parts to be removed are formed on the glass mask 38, and the transmissive area of the glass mask 38 corresponds to the dummy layer 32b and an area ranging from the position on the dummy layer to the adjacent edge portions on the upper surfaces of the electrode pad 32a and the probe connection pad 32c located at its both sides.

Accordingly, by conducting development processing to the exposed photosensitive insulating layer 36, an insulating layer 36a remains in a contiguous manner on the dummy layer 32b and the area ranging from the position on the dummy layer to the adjacent edge portions on the upper surfaces of the electrode pad 32a and the probe connection pad 32c located at its both sides, as shown in FIG. 3 (i).

Figure 4:
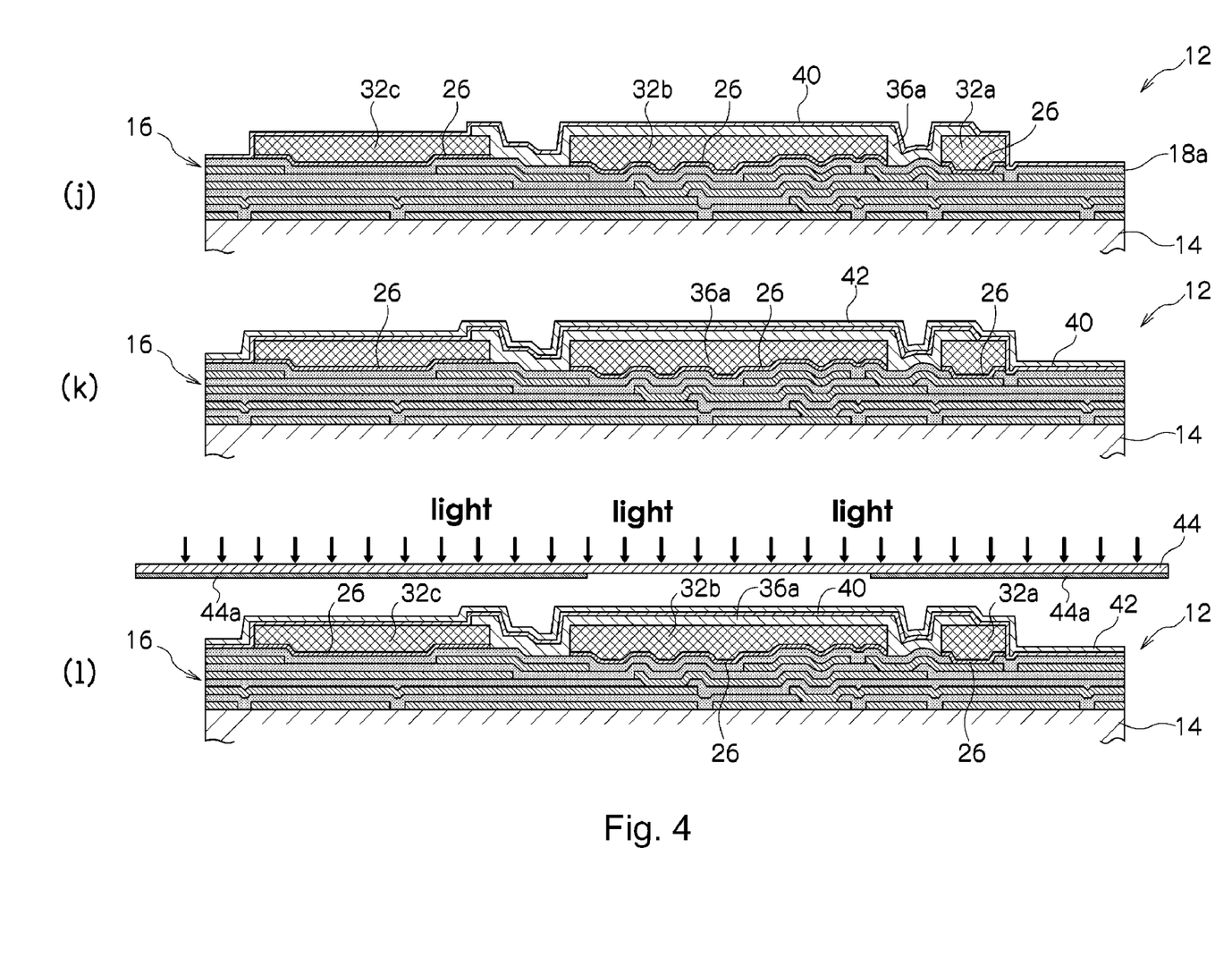
FIG. 4 is a schematic view showing the process for manufacturing the probe apparatus according to the present invention (No. 4).

After formation of the insulating layer 36a, Cr and Pd are deposited by e.g., a sputtering method or a deposition method on the insulating layer 36a, the surfaces of the electrode pad 32a and the probe connection pad 32c exposed from the insulating layer 36a, and the exposed surface of the insulating layer 18a, as shown in FIG. 4 (j). By this deposition, a Cr/Pd alloy layer 40 having an approximately uniform predetermined thickness dimension is formed over the surface of the insulating substrate 14. This Cr/Pd alloy layer is a thin-film resistive element layer 40 functioning as a thin-film resistive element and is utilized as a foundation electrode for later-described wire plating as well.

The thin-film resistive element layer 40 functioning both as a thin-film resistor and as a foundation layer for wire plating for the thin-film resistor may be made of a metal showing a required appropriate sheet resistance value such as tantalum nitride, tantalum oxide, a Cr element, a Ti element, a Ti/Pd alloy, or the like, instead of the Cr/Pd alloy. Also, titanium nitride may be used for the thin-film resistive element layer 40. However, the thin-film resistive element layer 40 made of the titanium nitride shows a relatively high sheet resistance value, and its variation is relatively high. On the contrary, the thin-film resistive element layer 40 made of the Cr/Pd alloy shows a lower and more appropriate sheet resistance value than that of the titanium nitride and is suitable for fine wires each having uniform thickness.

The thin-film resistive element layer 40 formed on the flat surface of the insulating layer 36a by the sputtering method or the deposition method after formation of the insulating layer 36a on the flat surface 34 of the dummy layer 32b with an approximately uniform thickness dimension is deposited over the dummy layer 32b to have an approximately uniform thickness dimension along the flat surface 34. Thus, since a part of the thin-film resistive element layer 40 over the dummy layer 32b is formed in a flat plate shape having approximately uniform thickness without waving in the up-down direction, change in the length due to the waving does not occur, and partial variation in the thickness dimension hardly occurs, and thus it shows more stable resistance value characteristics than a conventional resistive element formed on a convexo-concave surface does.

A thin-film resistive element showing a predetermined resistance value on the dummy layer 32b and necessary parts are left out of the thin-film resistive element layer 40, and unnecessary parts are removed from the thin-film resistive element layer 40. To do so, a photosensitive insulating layer 42 similar to the aforementioned one is formed to cover the entire surface of the thin-film resistive element layer 40, as shown in FIG. 4 (k). This photosensitive insulating layer 42 is exposed through a glass mask 44 and thereafter undergoes development processing as shown in FIG. 4 (l). On the glass mask 44, a transmissive opening having a desired flat surface shape is formed by shielded areas 44a. Also, this transmissive opening corresponds to the flat surface shape of a resistive element (40a) showing a predetermined resistance value on the dummy layer 32b.

Consequently, by the development processing of the photosensitive insulating layer 42, an insulating layer 42a having a flat surface shape corresponding to the flat surface shape of the desired resistive element remains on the dummy layer 32b, as shown in FIG. 5 (m).

Subsequently, a photoresist 46 similar to the aforementioned one is applied on the entire surface of the multilayer wiring board 12 including the insulating layer 42a, as shown in FIG. 5 (n). The photoresist 46 is exposed through a glass mask 48 having shielded areas 48a and thereafter undergoes development processing. As a result, on the photoresist 46 are respectively formed an opening 46a for a wiring path between the resistive element 40a formed on the dummy layer 32b and the electrode pad 32a and an opening 46b for a wiring path between the resistive element 40a and the probe connection pad 32c, as shown in FIG. 5 (o).

Using the thin-film resistive element layer 40 exposed and remaining at the bottom portions of these openings 46a, 46b as a foundation electrode, a conductive metal material such as copper is deposited in the respective openings 46a, 46b by a plating method, and wires 50 (50a, 50b) are formed by this deposit.

After formation of the wires 50 (50a, 50b), the photoresist 46 is removed, and the surface of the multilayer wiring board 12 is etched by ion beam, as shown in FIG. 6 (p). By this etching processing using the ion beam, the thin-film resistive element layer 40 is removed at the entire areas excluding wire plating portions (50a, 50b) into which the conductive metal material has been plated on the thin-film resistive element layer 40 and a part covered with the insulating layer 42a, as shown in FIG. 6 (q). At this time, although the exposed wires 50a, 50b are also etched, the wires 50a, 50b have thickness dimensions enough to put up with this etching processing. Also, although the insulating layer 42a gets thin as well, it will not disappear. Thus, under the insulating layer 42a is formed a resistive element 40a connected to the electrode pad 32a and the probe connection pad 32c respectively by the wires 50a, 50b and sealed by the insulating layer 42a.

As shown in FIG. 7 (r), on the probe connection pad 32c is fixed a probe 52 by e.g., welding with use of laser, with its probe tip 52a directing upward or in a direction distanced from the insulating substrate 14.

Accordingly, the thin-film resistive element 40a formed on the dummy layer 32b is connected to the electrode pad 32a via one wiring path 50a at its one edge and is connected to the probe 52 via the other wiring path 50b at its other edge. Thus, the probe 52 is connected to the conductive layer 20a or a conductive path constituting a part of the wiring paths inside the multilayer wiring board 12 via the thin-film resistive element 40a. The conductive path 20a connected to the electrode pad 32a is connected to a not shown tester.

Although one probe 52 has been shown representatively in FIGS. 1 to 7, numerous probes 52 are in fact provided on the multilayer wiring board 12 to correspond to electrode pads formed on a semiconductor IC as a device under test. Thus, by thrusting the probe tip 52a of each probe 52 on the multilayer wiring board 12 to the aforementioned corresponding electrode pad of the aforementioned device under test, it is possible to connect the aforementioned device under test to the aforementioned tester via the probe apparatus 10.

In the probe apparatus 10 according to the present invention, the resistive element 40a is inserted between the wires 50a and 50b connecting the electrode pad 32a to the probe connection pad 32c. Since this resistive element 40a is formed by a part of the flat thin-film resistive element layer 40 deposited on the flat surface 34 of the dummy layer 32b, it is formed in a flat plate shape having approximately uniform thickness without waving in the up-down direction. Therefore, the effective length of the resistive element 40a and the dimension in the length direction between both edges of the resistive element to which the wiring paths 50a, 50b are connected approximately correspond to each other.

Thus, without causing increase in the effective length due to the waving deformation of the resistive element 40a in the up-down direction or variation in the resistance value due to increase or decrease of the thickness dimension as in the conventional case, variation of the effective value of the resistive element 40a from a desired value can be reduced more than in the conventional case. Consequently, a resistive element having an appropriate resistance value can be inserted in the wiring paths of the multilayer wiring board 12 accurately, which is extremely advantageous to highly accurate electrical measurement.

Figure 8:
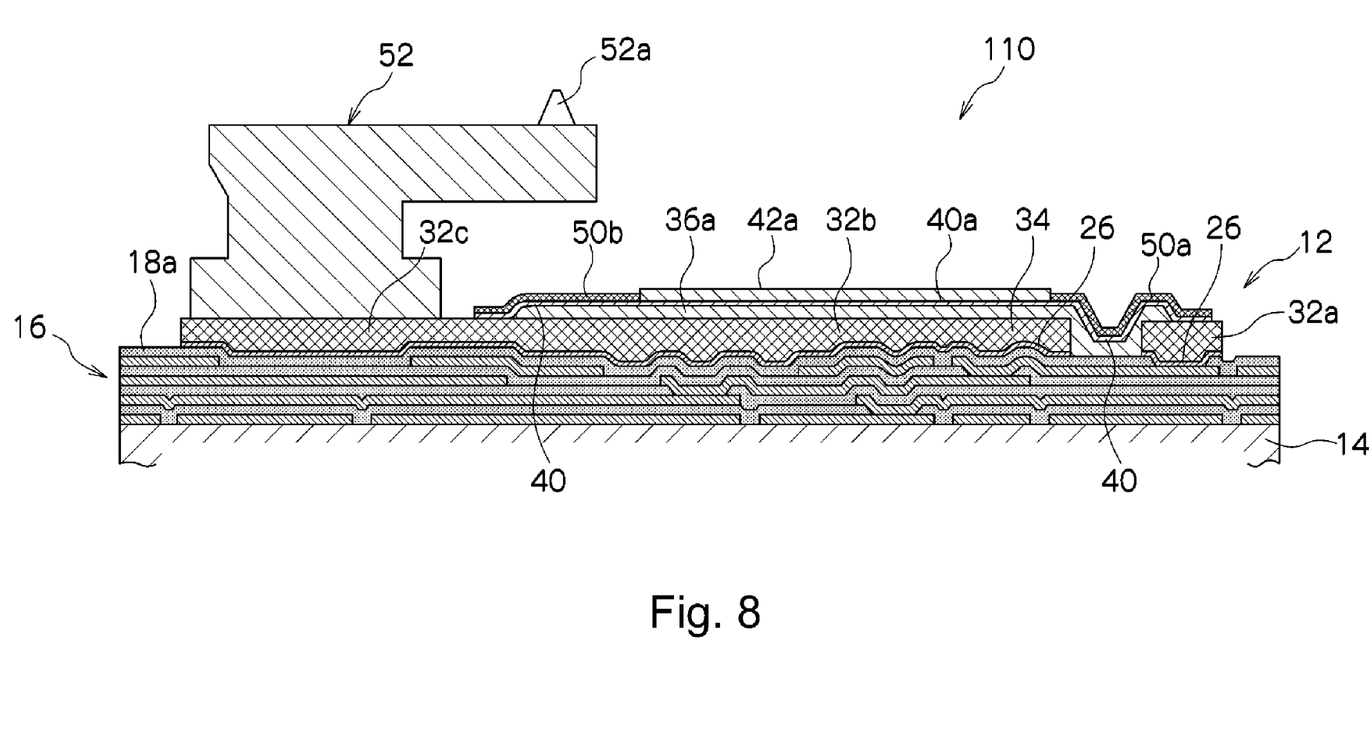
FIG. 8 is a view similar to FIG. 7 showing another embodiment of a probe apparatus according to the present invention.
Figure 9:
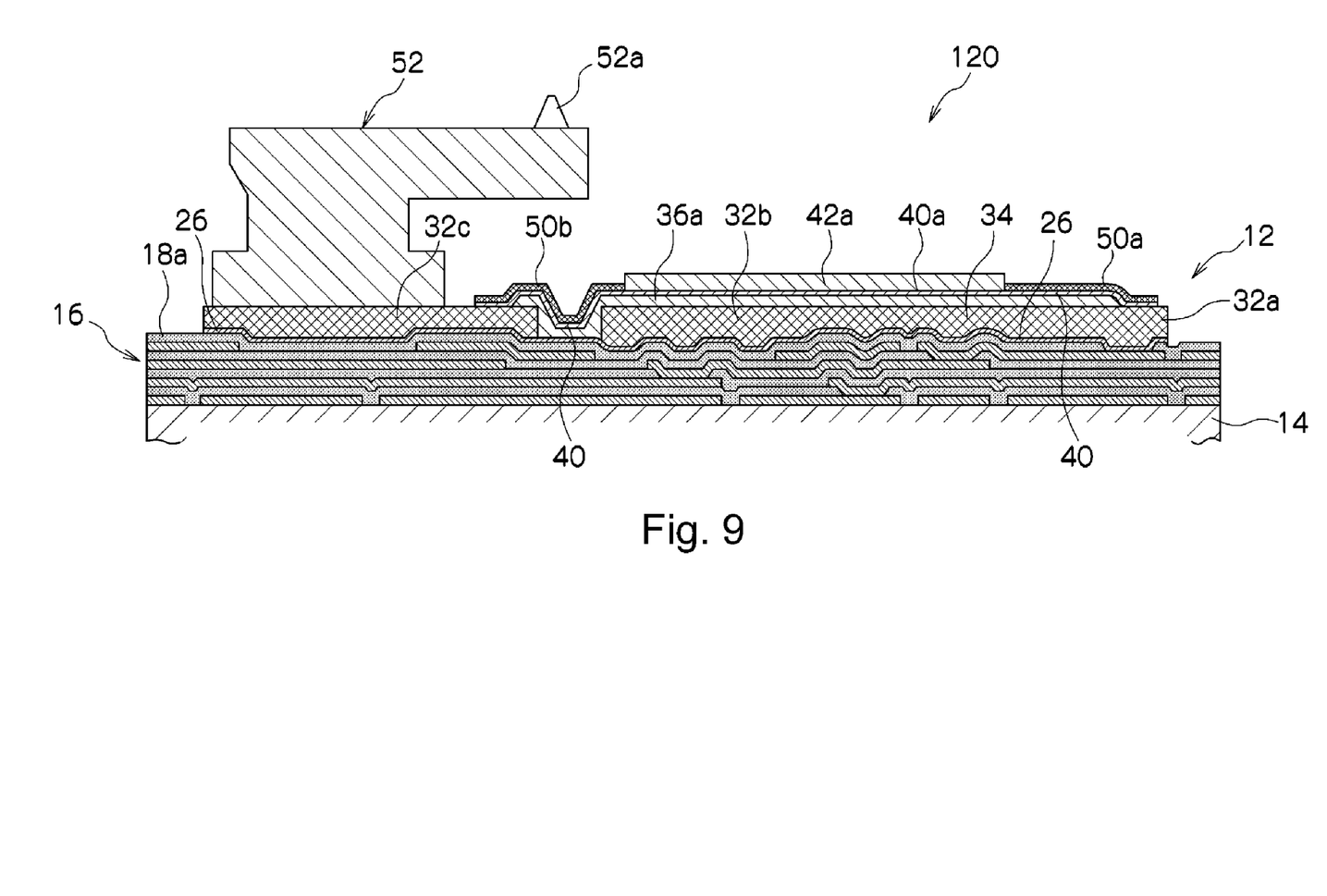
FIG. 9 is a view similar to FIG. 7 showing still another embodiment of a probe apparatus according to the present invention.

FIGS. 8 and 9 respectively show other examples of probe apparatuses according to the present invention. In a probe apparatus 110 shown in FIG. 8, the probe connection pad part 32c and the dummy layer part 32b are formed in a contiguous manner. This contiguous layer (32b, 32c) of the probe connection pad part and the dummy layer part can be used as a part of the aforementioned wiring paths of the multilayer wiring board 12. Also, in a probe apparatus 120 shown in FIG. 9, the electrode pad part 32a and the dummy layer part 32b are formed in a contiguous manner. This contiguous layer (32a, 32b) of the electrode pad part and the dummy layer part can be used as a part of the aforementioned wiring paths of the multilayer wiring board 12.

Also, in the aforementioned respective examples, one wiring path 50a out of the wiring paths 50a, 50b extending from the resistive element 40a of each of the probe apparatuses 10, 110, 120 is terminated on the wiring foundation area 40 without reaching the upper surface of the electrode pad 32a. Also, the other wiring path 50b is terminated on the wiring foundation area 40 without reaching the probe connection pad 32c. However, the aforementioned respective edge portions of these wiring paths 50a, 50b may be terminated on the corresponding pads 32a, 32c so as to contact the respective pads directly.

In the foregoing description, an example of forming the resistive element 40a on the flat surface 34 of the dummy layer 32b has been explained. In a case where the upper surface of the insulating layer 18a or a layer deposited on the insulating layer can be polished to be a flat surface, the thin-film resistive element layer 40 may be formed on this flat polished surface, instead of forming the dummy layer 32b.

Also, an electrical insulating material may be used as the dummy layer 32b. By forming the dummy layer 32b by the electrical insulating material, the insulating layer 36a on the dummy layer 32b can be eliminated. However, with respect to the fact that a process of forming the electrode pad 32a and the probe connection pad 32c is utilized to enable simultaneous formation of the dummy layer 32b and the fact that the dummy layer 32b can be utilized as a part of the wires, it is preferable that the dummy layer is made of a conductive material.

Also, although a single resistive element 40a has been shown in the foregoing description, the resistive element may be separated, and these separated resistive elements may be mutually connected in series to form a resistive element 40a.

The present invention is not limited to the above embodiments but may be altered in various ways without departing from the spirit and scope of the present invention. The present invention may also be applied to various kinds of implemented circuit boards, not only to the probe board of the probe apparatus.

What is claimed is:

1. A method for manufacturing a multilayer wiring board, comprising the steps of:

forming a flat surface at a desired area on a surface of a multilayer wiring board having a multilayer wiring layer, the multilayer wiring layer having a convexo-concave surface formed thereon; and depositing an electrical resistance material on said flat surface to form a resistive element;

wherein said flat surface is a surface of a dummy layer, and said dummy layer is formed by depositing a material for said dummy layer so that the material may have a thickness dimension enough to bury said convexo-concave surface within said desired area and thereafter polishing the material to be a flat surface; and wherein said dummy layer is made of a conductive material, and wherein said dummy layer is formed by forming a resist mask made of a photoresist to expose an area forming said flat surface and by depositing said conductive material for said dummy layer at an area exposed from said resist mask by an electroplating method.

2. The manufacturing method according to claim 1, wherein said conductive material for said dummy layer is deposited at the same time as deposition of a conductive material for formation of a wire on said multilayer wiring layer.

3. The manufacturing method according to claim 2, wherein an insulating layer made of an electrical insulating material is formed on said dummy layer, and said electrical resistance material is deposited on said insulating layer.

* * * * *